(12) United States Patent
Chen et al.

(10) Patent No.: US 12,376,331 B2
(45) Date of Patent: Jul. 29, 2025

(54) SEMICONDUCTOR POWER DEVICE AND METHOD OF MANUFACTURING THE SAME

(71) Applicant: LEAP Semiconductor Corp., Taoyuan (TW)

(72) Inventors: Wei-Fan Chen, Taichung (TW); Kuo-Chi Tsai, Taoyuan (TW)

(73) Assignee: LEAP Semiconductor Corp., Taoyuan (TW)

( * ) Notice: Subject to any disclaimer, the term of this patent is extended or adjusted under 35 U.S.C. 154(b) by 492 days.

(21) Appl. No.: 17/842,771

(22) Filed: Jun. 16, 2022

(65) Prior Publication Data
US 2023/0411515 A1    Dec. 21, 2023

(51) Int. Cl.
*H10D 62/10*    (2025.01)
*H10D 30/65*    (2025.01)
(Continued)

(52) U.S. Cl.
CPC ............. *H10D 30/65* (2025.01); *H10D 30/66* (2025.01); *H10D 62/127* (2025.01); *H10D 62/157* (2025.01)

(58) Field of Classification Search
CPC ....... H10D 62/107; H10D 62/125–126; H10D 62/127; H10D 30/66; H10D 30/662; H10D 30/0291–0297; H10D 12/032; H10D 12/035; H10D 12/038; H10D 12/441; H10D 12/461; H10D 12/481; H01L 29/062; H01L 29/0688; H01L 29/0692; H01L 29/0696; H01L 29/7802; H01L 29/66712; H01L 29/66719; H01L 29/66727; H01L 29/66734; H01L 29/66333; H01L 29/6634;
(Continued)

(56) References Cited

U.S. PATENT DOCUMENTS 6,117,135 A    9/2000   Schlapfer
6,956,238 B2  10/2005   Ryu et al.
(Continued)

OTHER PUBLICATIONS

Victor Veliadis, "Silicon Carbide Junction Field-Effect Transistors (SiC JFETS)," Wiley Encyclopedia of Electrical and Electronics Engineering, Dec. 2014, pp. 1-37.
(Continued)

*Primary Examiner* — Britt D Hanley
*Assistant Examiner* — Jason James Greaving
(74) *Attorney, Agent, or Firm* — JCIPRNET (57) ABSTRACT

A semiconductor power device includes a substrate, a drift layer disposed on the substrate, buried doped regions, gates, a gate insulation layer, well regions, source regions, and well contact regions. The buried doped regions are in the drift layer and parallel to each other, and each of the buried doped regions is a predetermined distance from an upper surface of the drift layer. The gates are on the drift layer and directly above the buried doped regions. The gate insulation layer is between the drift layer and the gates. The well regions are in the drift layer between the gates and separated from the buried doped regions, wherein the well regions and the buried doped regions are electrically connected. The source regions are within the well regions between the gates, and each of the well contact regions passes through the source region and contacts with the well.

8 Claims, 8 Drawing Sheets

(51) Int. Cl.
*H10D 30/66* (2025.01)
*H10D 62/13* (2025.01)

(58) Field of Classification Search
CPC .......... H01L 29/66348; H01L 29/7395; H01L 29/7396; H01L 29/7397
See application file for complete search history.

(56) References Cited

U.S. PATENT DOCUMENTS

| | | | |
|---|---|---|---|
| 7,439,563 | B2 | 10/2008 | Hatakeyama et al. |
| 10,453,923 | B2 | 10/2019 | Ohse et al. |
| 10,573,740 | B2 | 2/2020 | Kiyosawa |
| 10,950,695 | B1 | 3/2021 | Potera et al. |
| 2009/0072241 | A1* | 3/2009 | Harris ................ H10D 30/0297 257/77 |
| 2010/0224932 | A1* | 9/2010 | Takaya ................ H10D 62/157 257/E21.334 |
| 2012/0261715 | A1 | 10/2012 | Kim et al. |
| 2014/0124855 | A1* | 5/2014 | Hebert ................ H10D 30/668 257/334 |
| 2020/0035825 | A1* | 1/2020 | Kyogoku ............. H10D 30/668 |
| 2020/0303542 | A1 | 9/2020 | Mo et al. |

OTHER PUBLICATIONS

Jin Wei et al., "Low ON-Resistance SiC Trench/Planar MOSFET With Reduced OFF-State Oxide Field and Low Gate Charges," IEEE Electron Device Letters, vol. 37, Nov. 2016, pp. 1-4.
"Office Action of Taiwan Counterpart Application", issued on Oct. 25, 2023, pp. 1-6.

* cited by examiner

SEMICONDUCTOR POWER DEVICE AND METHOD OF MANUFACTURING THE SAME

BACKGROUND

Technical Field

The disclosure relates to a semiconductor power device, and particularly relates to a semiconductor power device and a method of manufacturing the same.

Description of Related Art

High voltage, field effect transistors, also known as power transistors or semiconductor power devices, are well known in the semiconductor arts. Vertical power transistor including an extended drain or drift region can support the applied high operation voltage, and this type power transistor(s) are commonly used in power conversion applications such as AC/DC converters for power supplies, motor controls, and so on. These power transistor devices can be switched at high voltages and achieve a high reverse blocking voltage in the "off" state while minimizing the resistance of current flow between the drain and the source, often referred to as the specific on resistance ($R_{on}$), in the "on" state.

Silicon carbide (SiC) MOSFETs are highly noticed due to their superior physical properties over silicon based devices of the same device area. For example, SiC MOSFETs are known to exhibit higher reverse blocking voltage, lower $R_{on}$, and higher thermal conductivity as compared to silicon MOSFETs.

The specific on resistance ($R_{on}$) in a vertical power MOSFET is a combination of the channel resistance, the JFET resistance, the drift region resistance and the substrate resistance. The channel resistance is a function of semiconductor material, channel width, channel length, operating conditions (e.g., drain current and voltage), carrier mobility and cell pitch. For optimal performance in the on state, it is desirable to minimize $R_{on}$. In a SiC power transistor device, the channel resistance is relatively high and the carrier mobility is relatively low. However, the drift region resistance is a direct function of blocking voltage. Consequently, channel resistance dominates $R_{on}$ at voltages less than about 3300 volts.

To reduce $R_{on}$ of SiC power MOSFETs, it is necessary to require complicated processing steps including trenches, new technologies, or trade-offs with respect to other device performance parameters, e.g., breakdown voltage. Additionally, attempts to lower $R_{on}$ by reducing the channel length have been largely unsuccessful as it adds leakage that lowers the reverse blocking voltage of the device.

SUMMARY

The disclosure provides a semiconductor power device for reducing specific on resistance ($R_{on}$) without complicated device design and influence on the performance such as reverse blocking voltage.

The disclosure further provides a method of manufacturing a semiconductor power device to lower $R_{on}$ without complicated processing steps.

The semiconductor power device of the disclosure includes at least a substrate, a drift layer, a plurality of buried doped regions, a plurality of gates, a gate insulation layer, a plurality of well regions, a plurality of source regions, and a plurality of well contact regions. The drift layer is disposed on the substrate, and the buried doped regions are disposed in the drift layer and parallel to each other. Each of the buried doped regions is a predetermined distance from an upper surface of the drift layer. The gates are disposed on the upper surface of the drift layer, and each of the gates is directly above each of the buried doped regions. The gate insulation layer is disposed between the drift layer and each of the gates. The well regions are disposed in the upper surface of the drift layer, and each of the well regions is between the gates and separated from the buried doped regions. The well regions and the buried doped regions are electrically connected. The source regions are disposed within the well regions between the gates, and the well contact regions are disposed in the upper surface of the drift layer. Each of the well contact regions passes through the source region and contacts with the well region.

In an embodiment of the disclosure, the semiconductor power device further includes a strip of doped region disposed in the drift layer to connect the plurality of well regions and the plurality of buried doped regions.

In an embodiment of the disclosure, the strip of doped region has an extension direction perpendicular to an extension direction of the plurality of gates.

In an embodiment of the disclosure, the gates are symmetrically disposed on both sides of the strip of doped region.

In an embodiment of the disclosure, a conductive type of the well regions is the same as a conductive type of the buried doped regions and different from a conductive type of the source regions.

In an embodiment of the disclosure, a doping concentration of the plurality of well regions is ranged from 5E16/cm³ to 1E18/cm³.

In an embodiment of the disclosure, a doping concentration of the plurality of buried doped regions is more than 2E18/cm³.

In an embodiment of the disclosure, the plurality of well regions partially overlaps with the plurality of buried doped regions in a vertical projection direction.

In an embodiment of the disclosure, two sides of each of the buried doped regions partially overlap with two sides of each of the well regions in a vertical projection direction.

In an embodiment of the disclosure, the semiconductor power device further includes a plurality of source electrodes, a plurality of gate electrodes, and a drain electrode. The source electrodes are disposed on the upper surface of the drift layer to be in direct contact with the well contact regions and the source regions respectively. The gate electrodes are respectively disposed on the gates, and the drain electrode is disposed on a bottom surface of the substrate.

The method of manufacturing the semiconductor power device includes forming a first drift layer on an upper surface of a substrate, and forming a plurality of buried doped regions in the first drift layer, wherein the buried doped regions are parallel to each other. A second drift layer is then formed on the first drift layer to cover the plurality of buried doped regions, and a strip of doped region is formed in the second drift layer to connect with the plurality of buried doped regions. A plurality of well regions is formed in an upper surface of the second drift layer, wherein the well regions and the buried doped regions are electrically connected via the strip of doped region. A gate insulation layer is formed on the upper surface of the second drift layer, and then a plurality of gates is formed on the gate insulation layer between the well regions. A plurality of source regions is formed in the plurality of well regions between the gates, and a plurality of well contact regions is formed in the upper surface of the second drift layer to pass through the source regions and contact with the well regions.

In another embodiment of the disclosure, after forming the well contact regions, the method further includes forming a plurality of source electrodes and a plurality of gate electrodes. The source electrodes are disposed on the upper surface of the second drift layer to be in direct contact with the plurality of well contact regions and the plurality of source regions, and the gate electrodes are disposed on the plurality of gates.

In another embodiment of the disclosure, after forming the source electrodes and the gate electrodes, the method further includes forming a drain electrode on a bottom surface of the substrate.

Based on the above, according to the semiconductor power device of the disclosure, the voltage drop in the gate insulation layer can be mitigated because of the presences of the buried doped regions, and thus the thickness of the gate insulation layer can be significantly reduced compared with conventional high voltage power device so as to lower the specific on resistance ($R_{on}$), thereby minimizing the resistance to current flow.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion.

Figure 1:
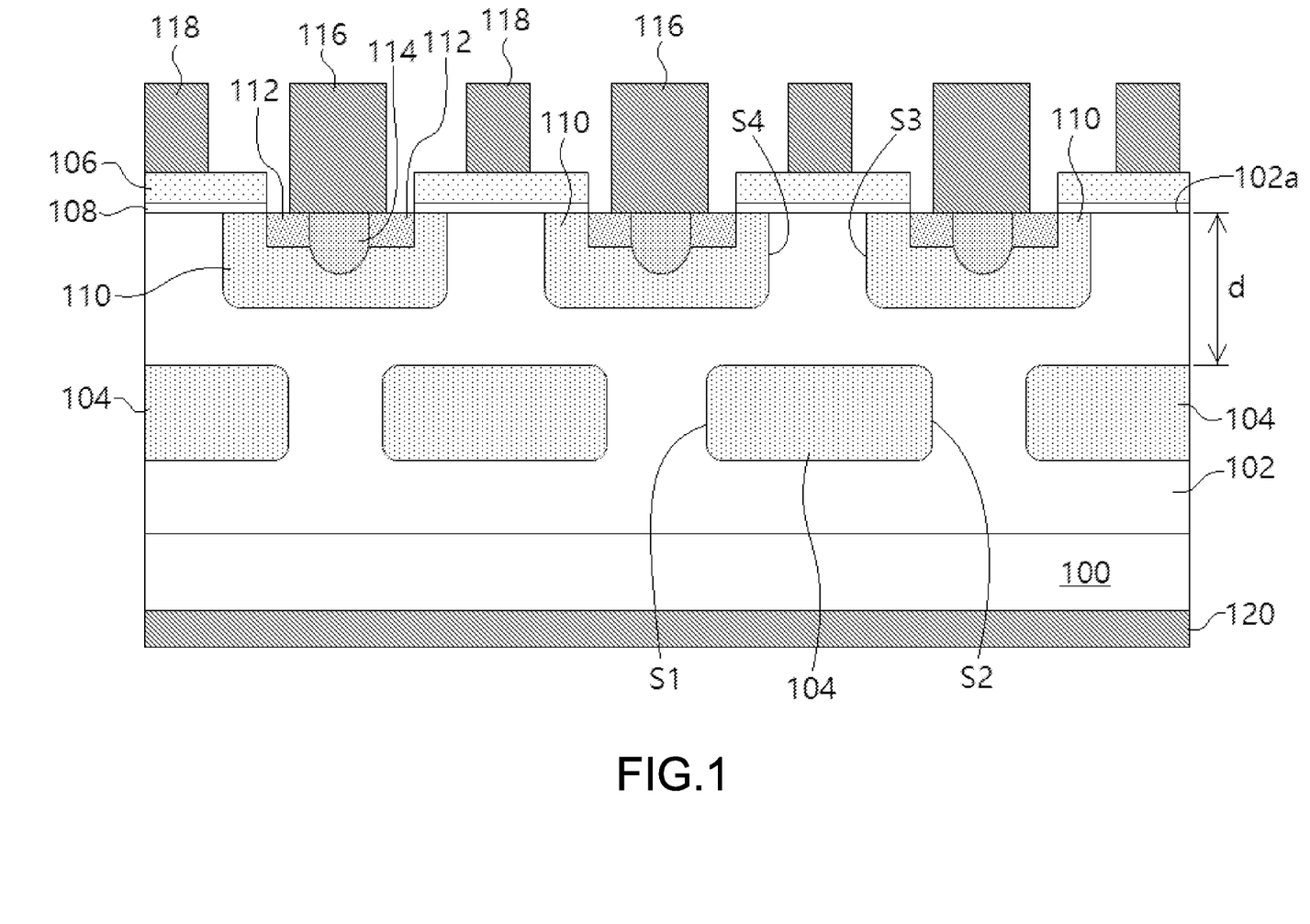
FIG. 1 is a cross-sectional view of a semiconductor power device according to an embodiment of the disclosure.

FIG. 1 is a cross-sectional view of a semiconductor power device according to an embodiment of the disclosure.

Figure 2:
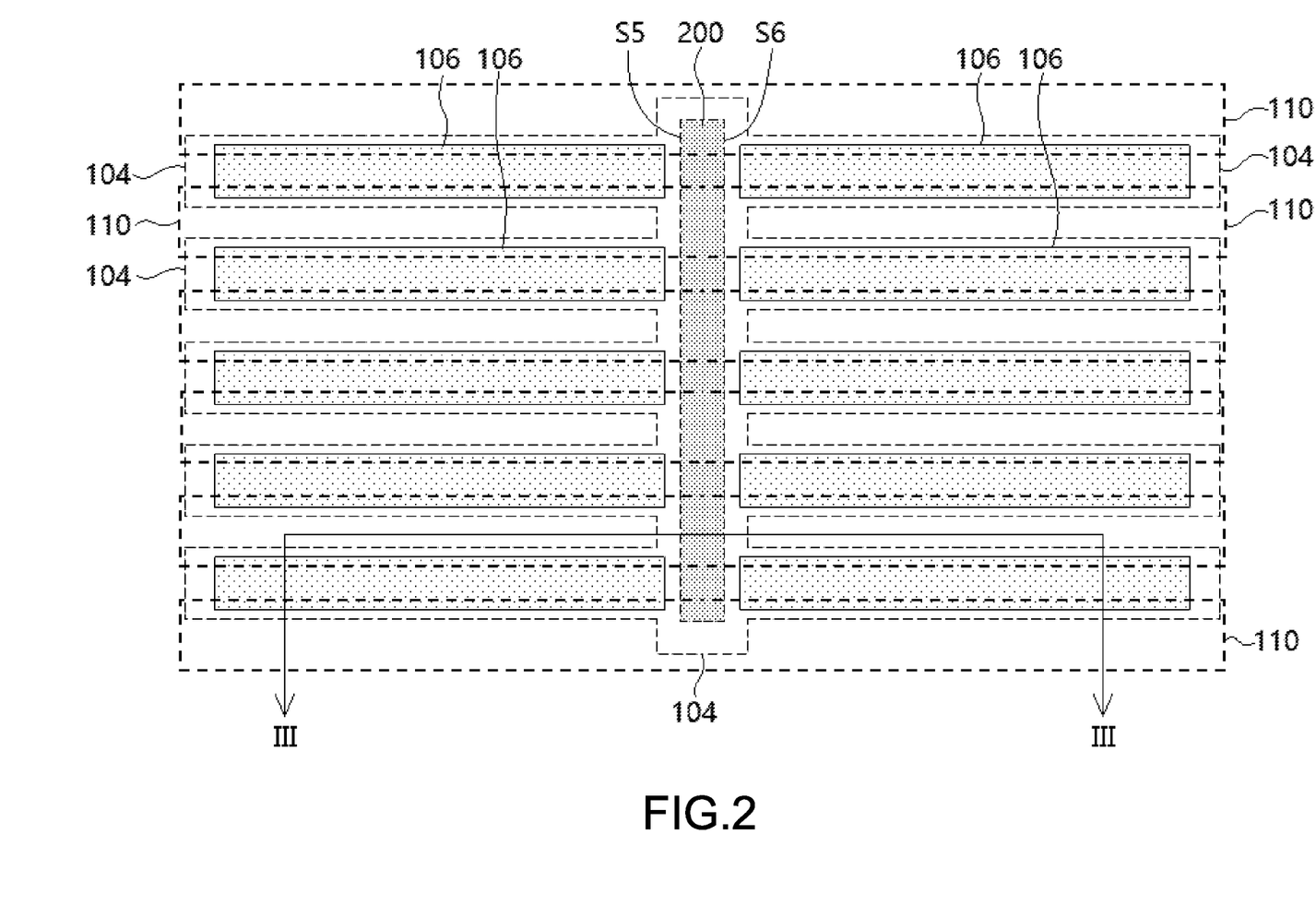
FIG. 2 is a plane view of the semiconductor power device of FIG. 1.

Referring to FIG. 1, the semiconductor power device of the embodiment includes at least a substrate 100, a drift layer 102, a plurality of buried doped regions 104, a plurality of gates 106, a gate insulation layer 108, a plurality of well regions 110, a plurality of source regions 112, and a plurality of well contact regions 114. The substrate 100 may be a high doping wideband semiconductor substrate such as a silicon carbide (SiC) substrate. However, the disclosure is not limited herein; in another embodiment, the substrate 100 is a silicon substrate. The drift layer 102 is disposed on the substrate 100. The material of the gates 106 is, for example, polysilicon, refractory metal, or refractory metal silicide. The buried doped regions 104 are disposed in the drift layer 102 and parallel to each other as shown in FIG. 2. FIG. 2 is a plane view of the semiconductor power device of FIG. 1, and some elements are omitted in FIG. 2 to clarify the positional relationship of the buried doped regions 104, the gates 106, and the well regions 110. Each of the buried doped regions 104 is a predetermined distance d from an upper surface 102a of the drift layer 102. The gates 106 are disposed on the upper surface 102a of the drift layer 102, and each of the gates 106 is directly above each of the buried doped regions 104. In one embodiment, the area of the buried doped region 104 is larger area than that of the gate 106 in a vertical projection direction. The gate insulation layer 108 is disposed between the drift layer 102 and each of the gates 106, and the gate insulation layer 108 may be a continuous film, or a discontinuous film as shown in FIG. 1.

Referring to FIG. 1 again, the well regions 110 are disposed in the upper surface 102a of the drift layer 102, and each of the well regions 110 is between the gates 106 and separated from the buried doped regions 104. The source regions 112 are disposed within the well regions 110 between the gates 106. The well contact regions 114 are disposed in the upper surface 102a of the drift layer 102, and each of the well contact regions 114 passes through the source region 112 and contacts with the well region 110. The conductive type of the well regions 110 is, for example, the same as the conductive type of the buried doped regions 104 and different from the conductive type of the source regions 112. Accordingly, the conductive type of the well contact regions 114 is the same as that of the well regions 110. In one embodiment, the well regions 110 and the buried doped regions 104 are p type well, the source regions 112 are n+ source, and the well contact regions 114 are p+ doping region. In another embodiment, the well regions 110 and the buried doped regions 104 are n type well, the source regions 112 are p+ source, and the well contact regions 114 are n+ doping region. In view of SiC power device, a doping concentration of the well regions 110 is ranged from $5E16/cm^3$ to $1E18/cm^3$, and a doping concentration of the buried doped regions 104 is more than $2E18/cm^3$. However, the disclosure is not limited herein; if the semiconductor power device is a silicon based power device, the doping concentrations of the well regions 110 and the buried doped regions 104 may be changed.

Please referring to FIGS. 1-2, the well regions 110 may partially overlap with the buried doped regions 104 in the vertical projection direction. For example, two sides S1 and S2 of each of the buried doped regions 104 partially overlap with two sides S3 and S4 of each of the well regions 110 in the vertical projection direction. In this embodiment, the well regions 110 and the buried doped regions 104 are electrically connected. For example, a strip of doped region 200 is formed to connect the plurality of well regions 110 and the plurality of buried doped regions 104. The strip of doped region 200 may be disposed in the drift layer 102 as shown FIG. 3 which is a cross-sectional view along the III-III line of FIG. 2. The strip of doped region 200 may be doped in the well region 110 before the formation of the well contact region 114, and thus the strip of doped region 200 also connect the well contact region 114 and the buried doped regions 104. In one embodiment, the strip of doped region 200 has an extension direction perpendicular to an extension direction of the plurality of gates 106, and the gates 106 can be designed to be symmetrically disposed on both sides S5 and S6 of the strip of doped region 200. Therefore, the strip of doped region 200 does not affect the current flow in the drift layer 102. The strip of doped region 200 is a continuous region in FIG. 2, but the disclosure is not limited herein; in another embodiment, the strip of doped region 200 may divide into several sub-regions distributed from top to bottom of FIG. 2, and each of the sub-regions connects one of well regions 110 and the buried doped region 104.

In FIG. 1, the semiconductor power device may further include a plurality of source electrodes 116, a plurality of gate electrodes 118, and a drain electrode 120. The source electrodes 116 are disposed on the upper surface 102a of the drift layer 102 to be in direct contact with the well contact regions 114 and the source regions 112 respectively. The gate electrodes 116 are respectively disposed on the gates 106, and the drain electrode 120 is disposed on a bottom surface of the substrate 100. The materials of the source electrodes 116, the gate electrodes 118, and the drain electrode 120 are, for example, metal, or alloy.

Figure 4:
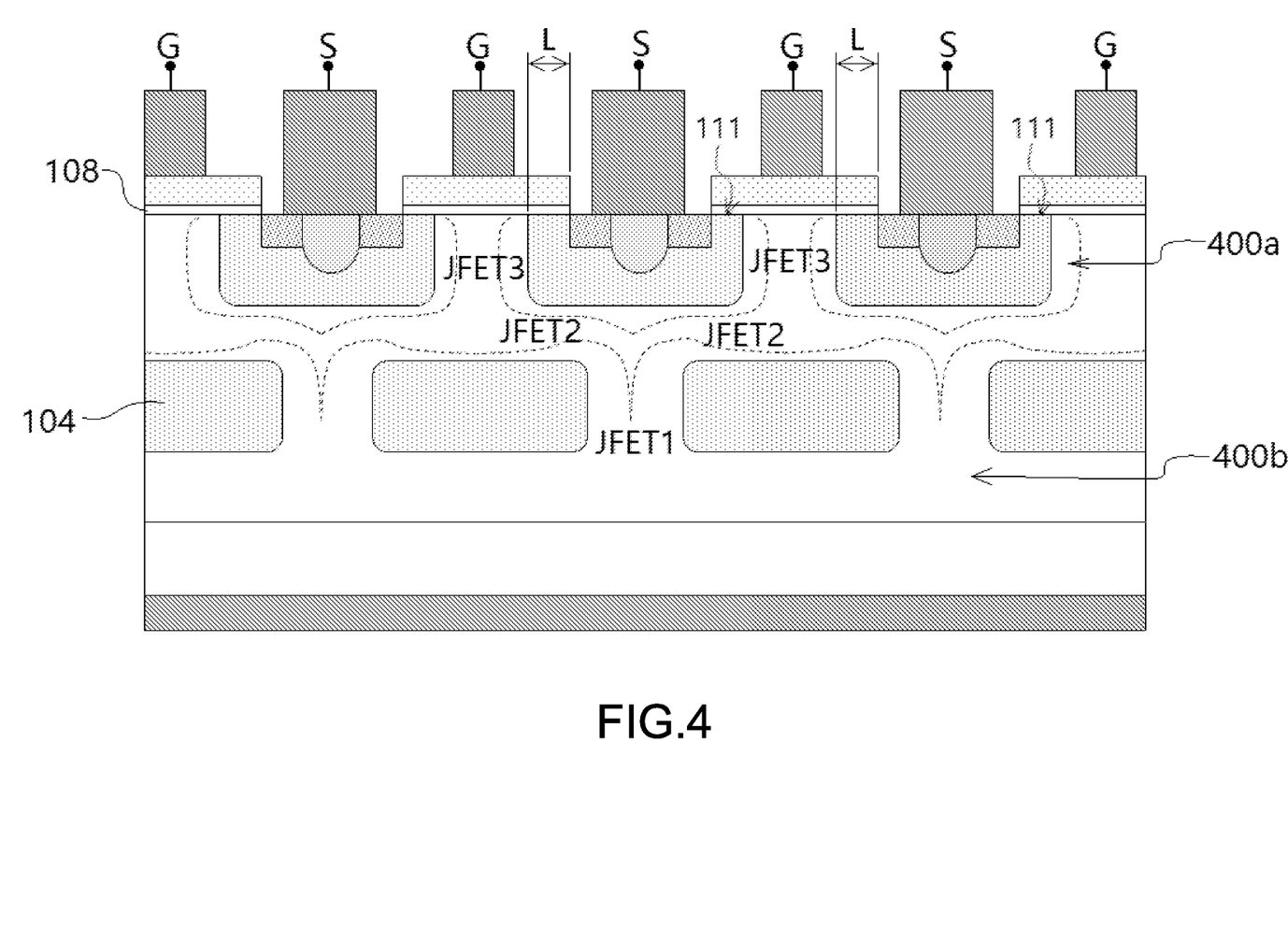
FIG. 4 shows the semiconductor power device of FIG. 1 in the off state.

FIG. 4 shows the semiconductor power device of FIG. 1 in the off state, wherein some reference symbols and labeled representations are omitted to clear the electrical property in the semiconductor power device. In FIG. 4, the areas enclosed by dashed lines represent the depletion regions 400a and 400b. The JFET1 region is pinch off in the off state, and thus the voltage drop in the gate insulation layer 108 (e.g. gate oxide) is become very little compared with the voltage drop in the JFET2 and JFET3 regions. Therefore, the thickness of the gate insulation layer 108 can be significantly reduced so as to lower the specific on resistance ($R_{on}$). To take a 600V MOSFET device (i.e. the semiconductor power device of FIG. 1) as an example, the voltage across the gate oxide (the gate insulation layer 108) is 5V only, so it is expected that a 200-300 Å thickness of gate oxide can be utilized. However, in the MOSFET device without the buried doped regions 104, the gate oxide with a 800-1200 Å thickness is required.

The following Tables 1-2 are simulation results by using the semiconductor power device of FIG. 1, wherein $R_{on}$ can be reduce to 0.04Ω. The device parameters and the electrical results are obtained by Silvaco's Victory Process simulator as well as Silvaco's Atlas Device simulator.

TABLE 1

| Doping concentration of the drift layer 102 | $4E16/cm^3$ | $3E16/cm^3$ | $2E16/cm^3$ | $1E16/cm^3$ |
|---|---|---|---|---|
| Breakdown Voltage (volt) | 554 | 685 | 944 | 1402 |
| MOS pitch (μm) | 9 | 10 | 11.8 | 14.9 |
| JFET1 open width (μm) | 3.5 | 3.8 | 4.3 | 5.2 |
| JFET2 open width (μm) | 2 | 2.2 | 2.6 | 3.4 |
| $R_{on}$ (Ω) | 0.04 | 0.07 | 0.15 | 0.27 |

MOS pitch represents the distance between central line of two gates.

JFET1 open width represents the spacing between two buried regions 104, the purpose of the buried region 104 is to block the applied electrical potential in the drain side as well as to form the JFET1 open that allows current passes between the drain and source terminals, the current path sometime is called "channel." With the aids of the buried regions 104, 90% of the electrical potential in the drain side are block in the buried regions 104, and the channel of JFET1 still keeps low resistivity that enough pass the current without significant $I*R_{jeft1}$. $R_{jeft1}$ means the equivalent resistance of the channel.

JFET2 open width represents the interval between the well regions 110 and buried regions 104 in the thickness direction. The remain 10% of the electrical potential in the drain side can be further blocked between the well regions 110 and the buried regions 104 so as to form current passes between the drain and source terminals in the JFET2 channel. The interval between the well regions 110 and buried regions 104 can be optimized that allow the max current pass the channel of JFET2, and thus the $R_{jeft2}$ can be minimized in the optimization interval between the well regions 110 and the buried regions 104 without significant $Rds_{on}$ loss in the semiconductor power device.

The optimization JFET opens are listed in Table1. With the aid of drain voltage block mechanism of JFET1 and JFET2 in FIG. 4, the remain potential drop in the channel region 111 of MOSFET is insignificant that allow the channel length L can be as low as 0.15 μm, compared with tradition Vertical MOSFET in which the channel length>3 μm. The $Rds_{on}$ is, therefore, reduced according to the disclosure.

TABLE 2

| Doping concentration of the drift layer 102 | $8E15/cm^3$ | $6E15/cm^3$ | $4E15/cm^3$ | $3E15/cm^3$ |
|---|---|---|---|---|
| Breakdown Voltage (volt) | 1590 | 1801 | 3040 | 6010 |
| MOS pitch (μm) | 15.3 | 16.2 | 21 | 29 |
| JFET1 open width (μm) | 6.2 | 6.5 | 7.8 | 9.2 |
| JFET2 open width (μm) | 3.4 | 3.6 | 4.7 | 6.6 |
| $R_{on}$ (Ω) | 0.4 | 0.72 | 1.5 | 3.1 |

FIGS. 5A to 5G are cross-sectional views illustrating steps of a method of manufacturing a semiconductor power device according to another embodiment of the disclosure, wherein the reference symbols used in above embodiment are used to equally represent the same or similar components. The description of the same components can be derived from above embodiment, and will not be repeated herein.

Figure 5A:
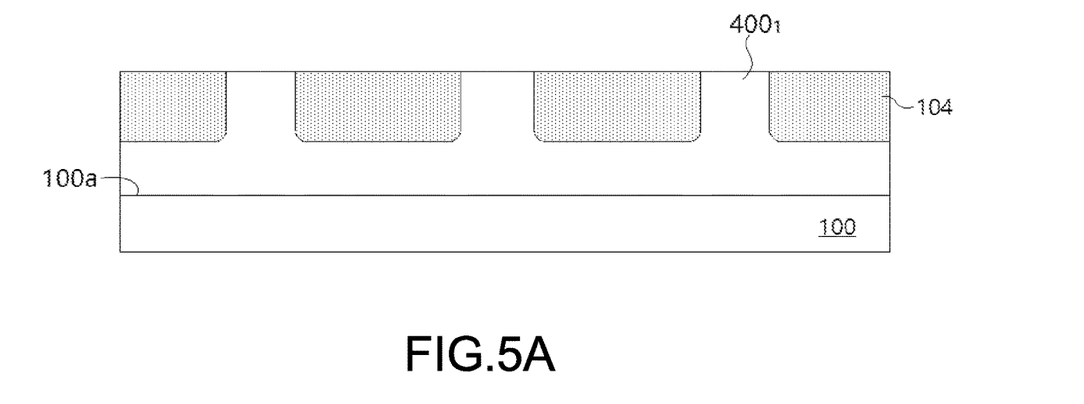
FIGS. 5A to 5G are cross-sectional views illustrating steps of a method of manufacturing a semiconductor power device according to another embodiment of the disclosure.

Referring to FIG. 5A, a first drift layer $400_1$ is formed on an upper surface 100a of a substrate 100, and then a plurality of buried doped regions 104 is formed in the first drift layer $400_1$, wherein the buried doped regions 104 are parallel to each other. In one embodiment, the substrate 100 is n type substrate, and the first drift layer $400_1$ is N− drift layer. The method of forming the buried doped regions 104 may be a doping step using a patterned photoresist (not shown) covering a portion of the first drift layer $400_1$.

Figure 5B:
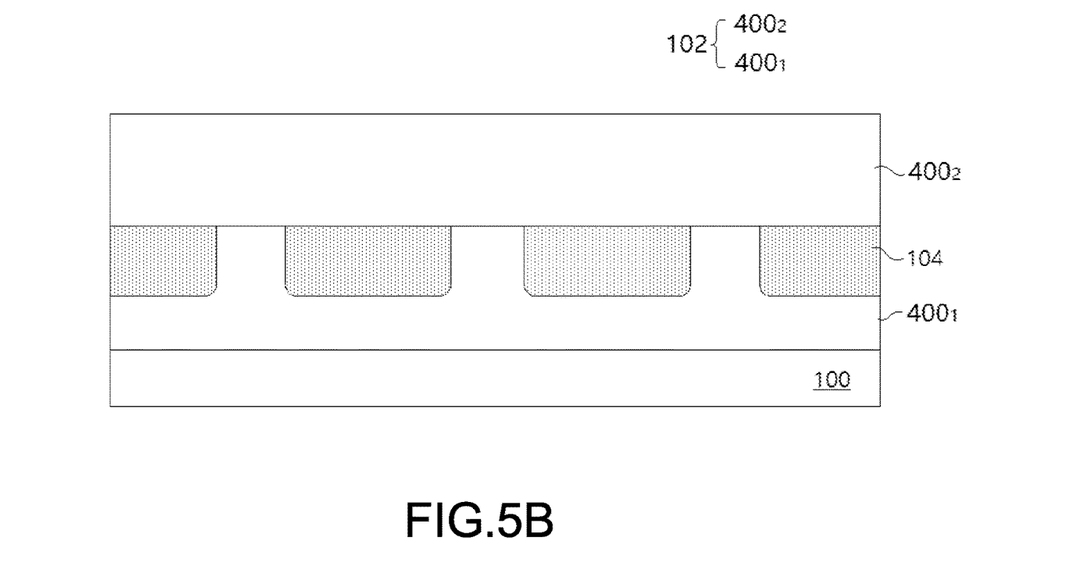

Then, referring to FIG. 5B, a second drift layer $400_2$ is formed on the first drift layer $400_1$ to cover the plurality of buried doped regions 104, wherein the drift layer 102 consist of the first drift layer $400_1$ and the second drift layer $400_2$. A strip of doped region 200 is then formed in the second drift layer $400_2$ to connect with the plurality of buried doped regions 104 as shown in FIG. 5H. The method of forming the strip of doped region 200 may be a doping step using a patterned photoresist (not shown) covering a portion of the second drift layer $400_2$. In FIG. 5H, the strip of doped region 200 extends into the buried doped region 104, but the disclosure is not limited herein; in another embodiment, the strip of doped region 200 may be only formed in the second drift layer $400_2$ and in direct contact with a top of the first drift layer $400_1$.

Figure 3:
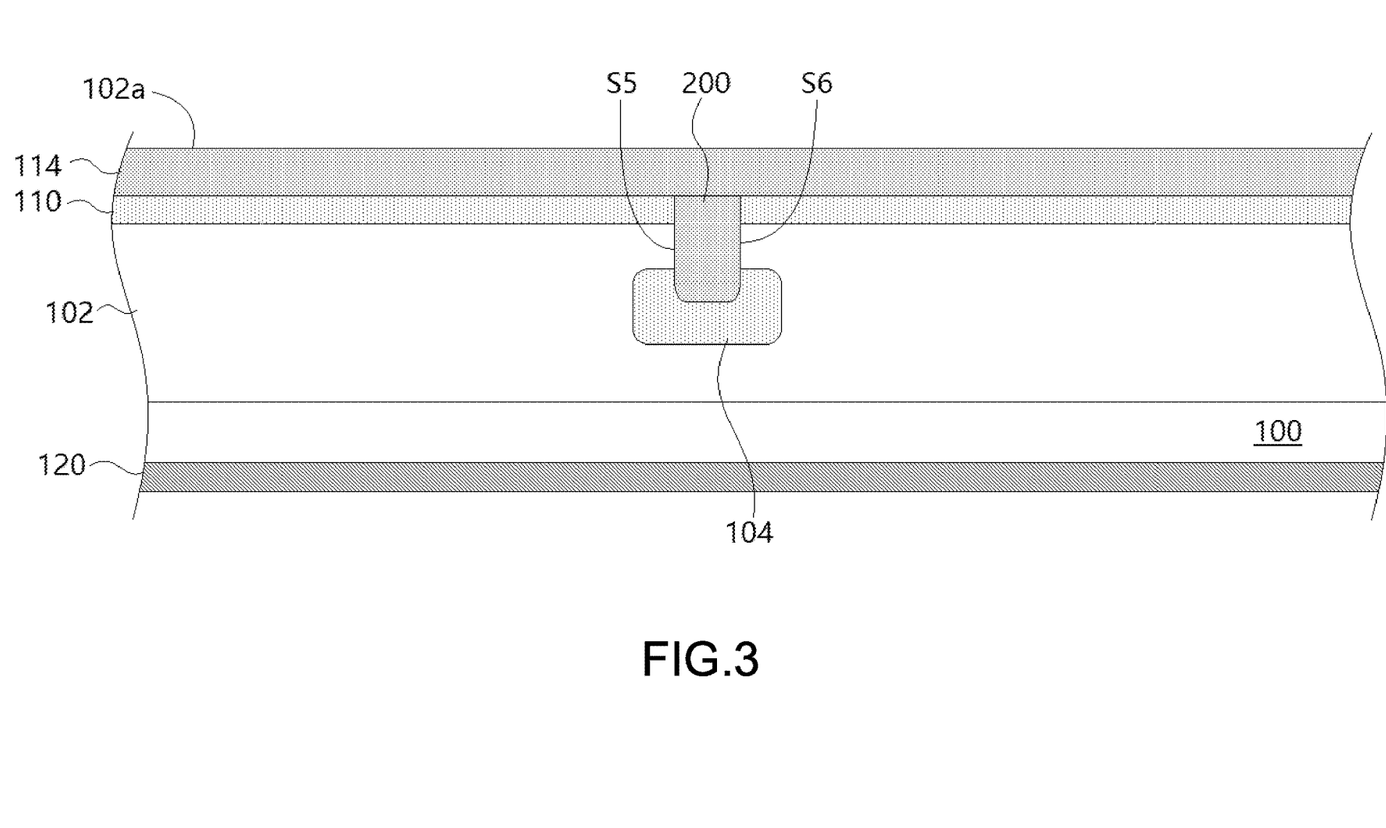
FIG. 3 is a cross-sectional view along the III-III line of FIG. 2.
Figure 5C:
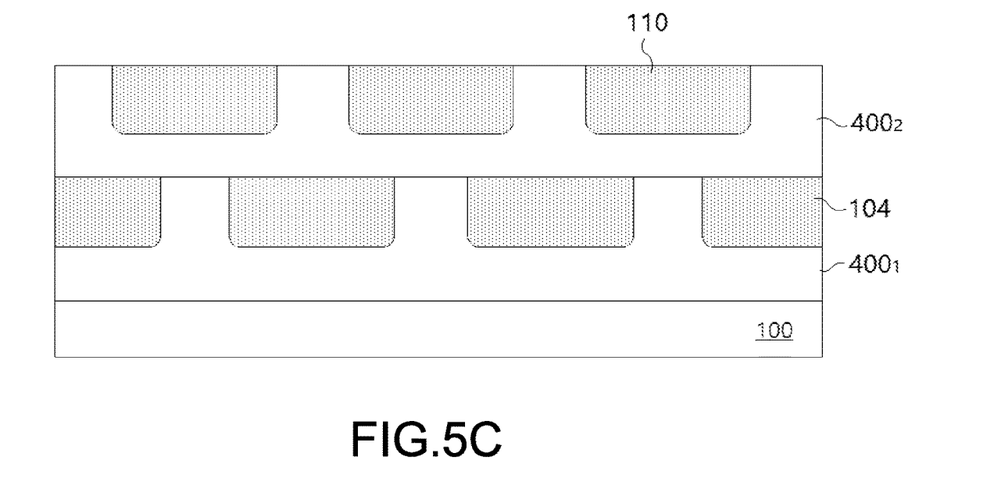

Then, referring to FIG. 5C, a plurality of well regions 110 is formed in an upper surface 402 of the second drift layer 400₂, and the method of forming the well regions 110 may be a doping step using a patterned photoresist (not shown) covering a portion of the upper surface 402. The well regions 110 and the buried doped regions 104 are electrically connected via the strip of doped region 200 as shown in FIG. 3.

Figure 5D:
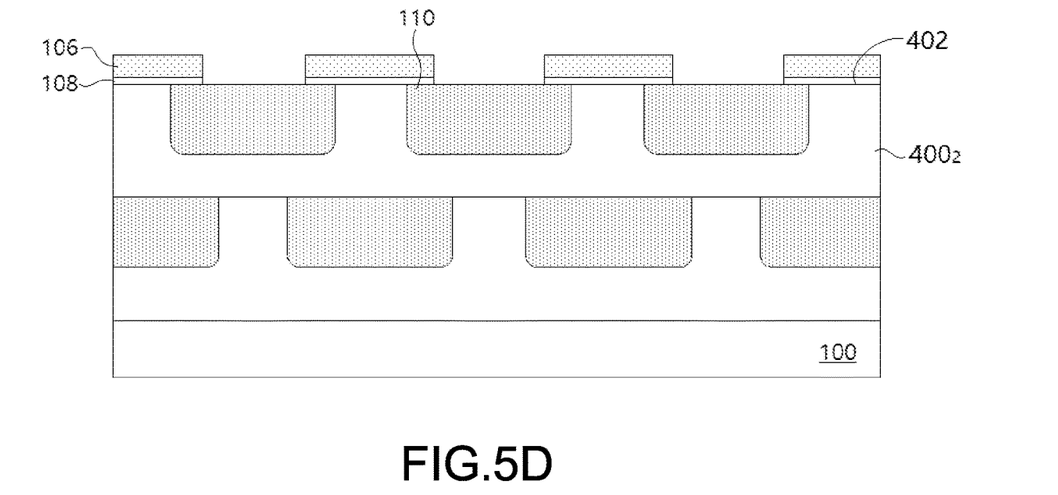

Thereafter, referring to FIG. 5D, a gate insulation layer 108 is formed on the upper surface 402 of the second drift layer 400₂, and then a plurality of gates 106 is formed on the gate insulation layer 108 between the well regions 110. The method of forming the gate insulation layer 108 and the gates 106 may include forming an entire gate oxide layer and a material for the gates on the upper surface 402 in order, and then etching them using a patterned photoresist (not shown) covering the portion of the upper surface 402 above the well regions 110 as an etching mask.

Figure 5E:
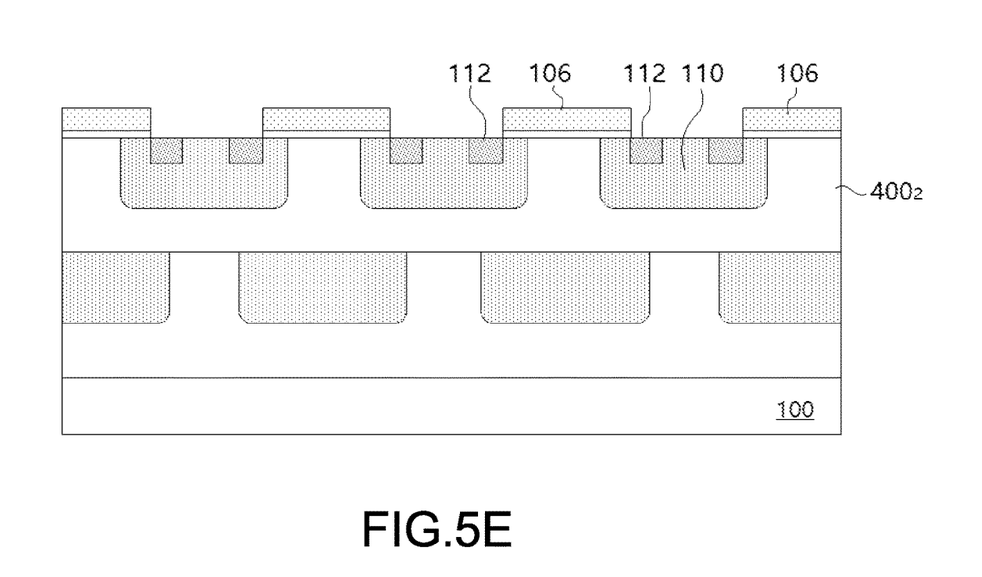

Then, referring to FIG. 5E, a plurality of source regions 112 is formed in the well regions 110 between the gates 106. The method of forming the source regions 112 may be a doping step using a patterned photoresist (not shown) covering a portion of the well regions 110.

Figure 5F:
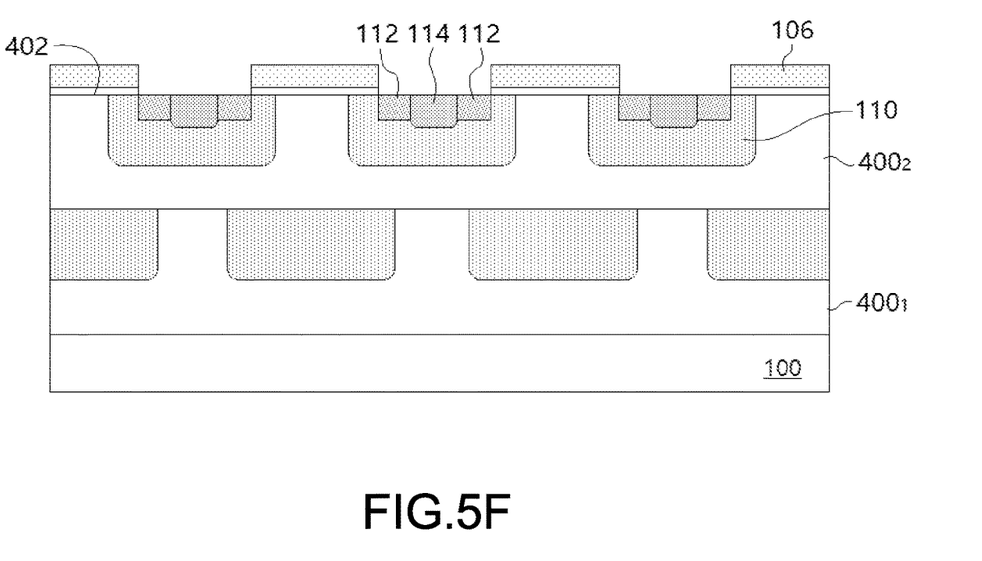

After that, referring to FIG. 5F, a plurality of well contact regions 114 is formed in the upper surface 402 of the second drift layer 400₂ to pass through the source regions 112 and contact with the well regions 110. The method of forming the well contact regions 114 may be a doping step using a patterned photomask (not shown) covering the source regions 112.

Figure 5G:
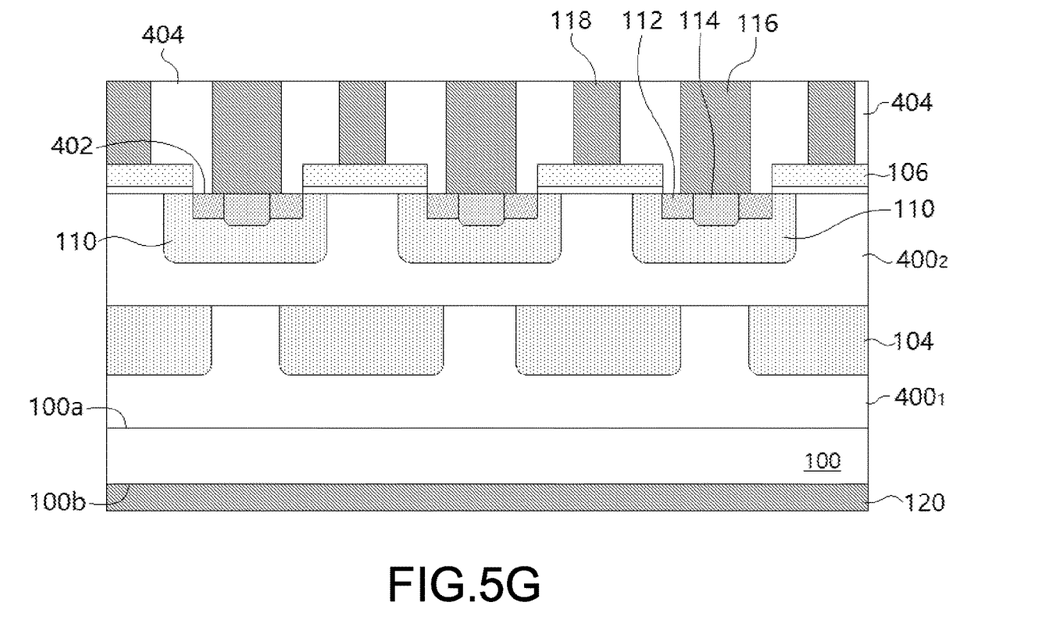
Figure 5H:
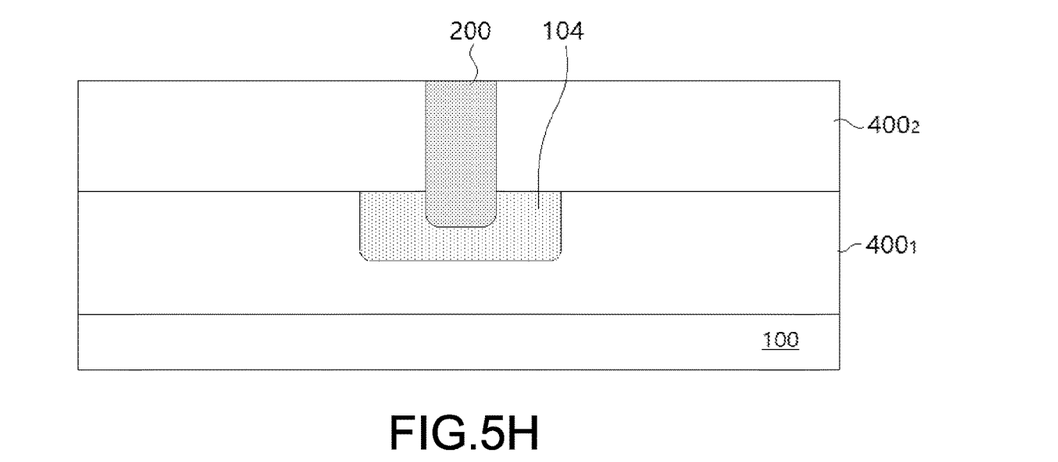
FIG. 5H is a cross-sectional view illustrating a step of FIG. 5B along a different section line.

Thereafter, referring to FIG. 5G, source electrodes 116 and gate electrodes 118 are formed together. The source electrodes 116 are disposed on the upper surface 402 of the second drift layer 4002 to be in direct contact with the plurality of well contact regions 114 and the plurality of source regions 112, and the gate electrodes 118 are disposed on the plurality of gates 106. The method of forming the source electrodes 116 and the gate electrodes 118 may include forming an insulation layer 404 on the upper surface 402 and the gates 106, etching the insulation layer 404 to form openings exposing the well contact regions 114, the source regions 112, and the gate 106 respectively, and depositing conductive material (e.g. metal or alloy) in the openings. After forming the source electrodes 116 and the gate electrodes 118, a drain electrode 120 is formed on a bottom surface 100b of the substrate 100.

In summary, since the semiconductor power device has buried doped regions distributed in the drift layer to from the depletion regions in the drift layer and extend current flow paths, and thus it can reduce the voltage drop in the gate insulation layer. Accordingly, the thickness of the gate insulation layer can become very thin, thereby significantly reducing specific on resistance ($R_{on}$).

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor power device, comprising:
    a substrate;
    a drift layer disposed on the substrate;
    a plurality of buried doped regions disposed in the drift layer and parallel to each other, and each of the buried doped regions is a predetermined distance from an upper surface of the drift layer;
    a plurality of gates disposed on the upper surface of the drift layer, and each of the gates is directly above each of the buried doped regions;
    a gate insulation layer disposed between the drift layer and each of the gates;
    a plurality of well regions disposed in the upper surface of the drift layer, and each of the well regions is between the gates and separated from the buried doped regions, wherein the well regions and the buried doped regions are electrically connected;
    a plurality of source regions disposed within the plurality of well regions between the gates;
    a plurality of well contact regions disposed in the upper surface of the drift layer, and each of the well contact regions passes through the source region and contacts with the well region; and
    a strip of doped region disposed in the drift layer to connect the plurality of well regions and the plurality of buried doped regions, wherein the strip of doped region has an extension direction perpendicular to an extension direction of the plurality of gates, and the strip of doped region is in direct contact with the plurality of well contact regions.

2. The semiconductor power device of claim 1, wherein the gates are symmetrically disposed on both sides of the strip of doped region.

3. The semiconductor power device of claim 1, wherein a conductive type of the plurality of well regions is the same as a conductive type of the plurality of buried doped regions and different from a conductive type of the plurality of source regions.

4. The semiconductor power device of claim 1, wherein a doping concentration of the plurality of well regions is ranged from $5E16/cm^3$ to $1E18/cm^3$.

5. The semiconductor power device of claim 1, wherein a doping concentration of the plurality of buried doped regions is more than $2E18/cm^3$.

6. The semiconductor power device of claim 1, wherein the plurality of well regions partially overlaps with the plurality of buried doped regions in a vertical projection direction.

7. The semiconductor power device of claim 1, wherein two sides of each of the buried doped regions partially overlap with two sides of each of the well regions in a vertical projection direction.

8. The semiconductor power device of claim 1, further comprising:
    a plurality of source electrodes disposed on the upper surface of the drift layer to be in direct contact with the plurality of well contact regions and the plurality of source regions;
    a plurality of gate electrodes disposed on the plurality of gates; and
    a drain electrode disposed on a bottom surface of the substrate.

* * * * *